United States Patent [19]
Cheng et al.

[11] Patent Number: 6,007,390
[45] Date of Patent: Dec. 28, 1999

[54] LOW FRICTION METAL-CERAMIC COMPOSITE COATINGS FOR ELECTRICAL CONTACTS

[75] Inventors: Yang-Tse Cheng, Rochester Hills, Mich.; George Albert Drew, Warren, Ohio; Bryan A. Gillispie, Warren; Wen-Jin Meng, Novi, both of Mich.

[73] Assignee: General Motors Corporation, Detroit, Mich.

[21] Appl. No.: 09/109,284

[22] Filed: Jun. 30, 1998

[51] Int. Cl.[6] .................................................... H01R 9/24

[52] U.S. Cl. ............................................ 439/886; 428/673

[58] Field of Search ............................. 439/886; 428/546, 428/457, 548, 615, 672, 673

[56] References Cited

U.S. PATENT DOCUMENTS

| | | | |
|---|---|---|---|
| 4,405,849 | 9/1983 | Frame | 200/262 |
| 4,591,418 | 5/1986 | Snyder | 204/192.16 |
| 4,745,035 | 5/1988 | Saurer et al. | 428/614 |
| 4,925,394 | 5/1990 | Hayashi et al. | 439/86 |
| 5,679,471 | 10/1997 | Cheng et al. | 428/673 |

*Primary Examiner*—Steven L. Stephan
*Assistant Examiner*—T. C. Patel
*Attorney, Agent, or Firm*—Patrick M. Griffin

[57] ABSTRACT

An electrical terminal is disclosed where the terminal is formed of an electrically-conductive metal substrate such as copper alloys, aluminum alloys or stainless steel with the substrate having a codeposited composite coating of titanium nitride and gold or silver on the surface. The coating provides wear resistance in high temperature and vibration environments while retaining and demonstrating low friction and low contact resistance properties.

2 Claims, 4 Drawing Sheets

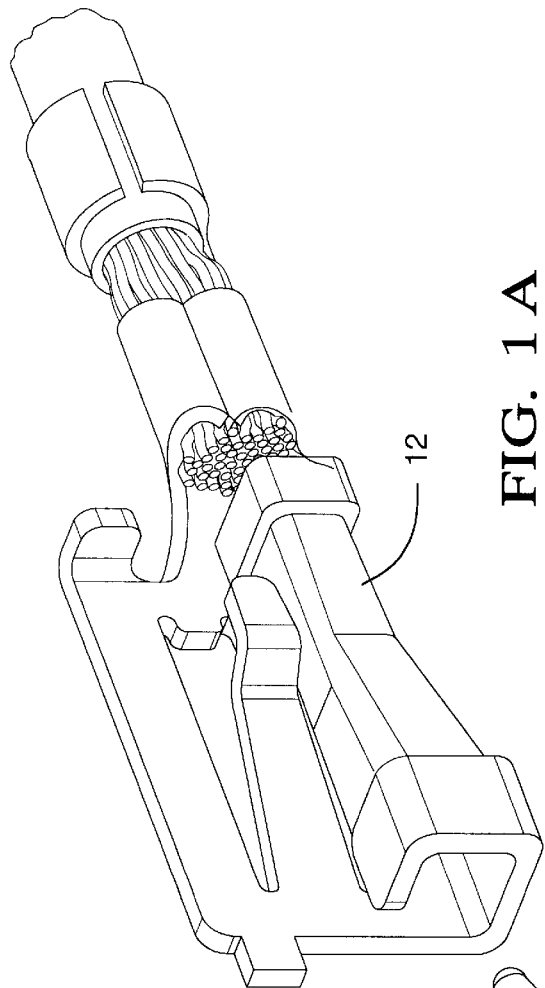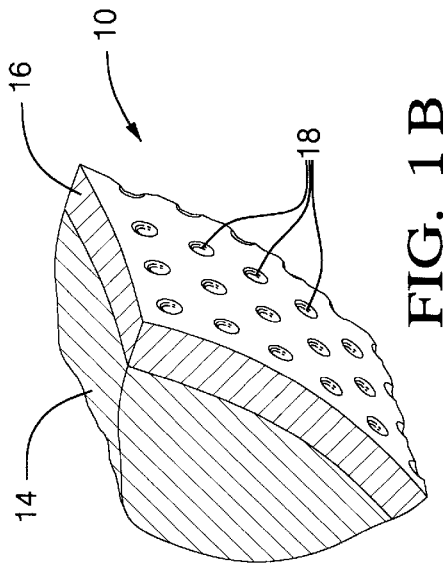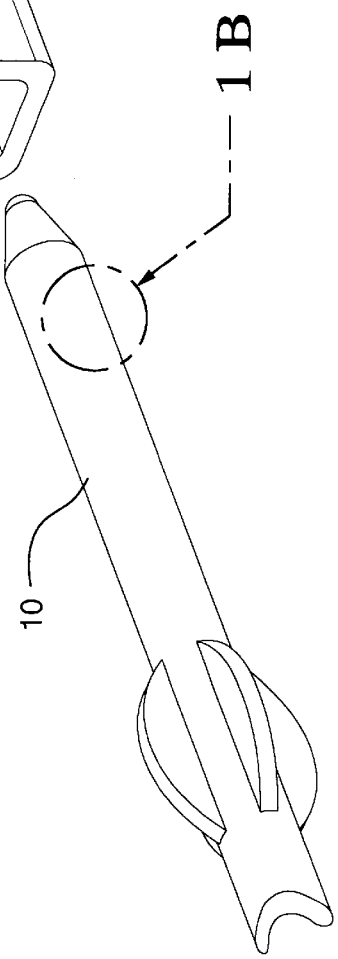
FIG. 1A
FIG. 1B

LOW FRICTION METAL-CERAMIC COMPOSITE COATINGS FOR ELECTRICAL CONTACTS

TECHNICAL FIELD

This invention pertains to improved coatings for use on the contact surfaces of metallic electrical terminals. More specifically, this invention pertains to certain metal-ceramic composite coatings for such terminals operating in high temperature and high vibration environments.

BACKGROUND OF THE INVENTION

Modern automotive vehicles have an increasing content of electrical and electronic devices that require wires with electrical terminals at the ends for their use in vehicles. This increased electrical content in the vehicle occurs at the same time that there is also an increase in the number of components attached or fixed around the engine in the underhood engine compartment of the vehicle. This congestion in the engine compartment reduces ambient cooling of the compartment area and leads to higher temperatures in the compartment. Because the operating engine causes or experiences some vibration, underhood electrical connections on passenger cars and trucks can be exposed to temperatures above 150° C., combined with severe vibration. Some electrical terminal contact materials, such as, for example, gold, have high softening temperatures and can withstand operating temperatures above 150° C. However, high vibration can quickly degrade their contact properties. Vibration can cause microscopic relative movement at electrical contact interfaces that quickly wears away existing contact materials. The result is unstable or intermittent connection resistance, which can adversely affect vehicle performance.

The vibration resistance of a connector can be improved by minimizing the relative movement at contact interfaces. This normally requires improved connector locks, seals and wiring harness strain relief features, all of which add to the cost of the wiring of the vehicle. An alternative to minimizing terminal movement is to develop electrical contact materials with improved wear and temperature resistance. It is an object of this invention to provide a new terminal coating material with outstanding wear resistance and good high temperature electrical performance.

SUMMARY OF THE INVENTION

This invention provides a metal-ceramic coating for electrical contact applications with low friction, good wear resistance and low contact resistance. In a preferred embodiment of the invention, the coating is a codeposited layer of titanium nitride and silver on a suitable electrically-conductive metal terminal substrate. Examples of suitable terminal materials are aluminum alloys, copper alloys and stainless steel.

The electrically-conductive ceramic, titanium nitride, and silver metal are codeposited by physical vapor deposition on a clean metal terminal surface. The vapor codeposition of titanium nitride and silver provides a hard, relatively low internal stress layer of titanium nitride with discrete particles of silver on the outer surface of the ceramic layer. Silver preferably constitutes 1 to 10 atomic percent of the composite coating and is found largely at the surface of the dense crystalline titanium nitride layer. The presence of the silver reduces the friction between the coated terminal and a complementary terminal body for making easy connections. The combination of the titanium nitride and silver provides low contact resistance, even after repeated engagement and disengagement of the terminals and after exposure to temperatures of 150° C. and higher in air.

The invention has been demonstrated using titanium nitride and silver as the codeposited materials. Other suitable metals such as gold can be employed.

Other objects and advantages of the invention will become more apparent from a detailed description of the invention which follows. Reference will be had to the drawings, which are described below.

BRIEF DESCRIPTION OF THE DRAWINGS

FIG. 1A is a perspective view of a representative male/female type automotive electrical terminal connector pair.

FIG. 1B is an enlarged portion of a section of one of the terminals in FIG. 1A, the enlarged view showing the subject metal-ceramic coating.

DESCRIPTION OF THE PREFERRED EMBODIMENT

Figure 2:
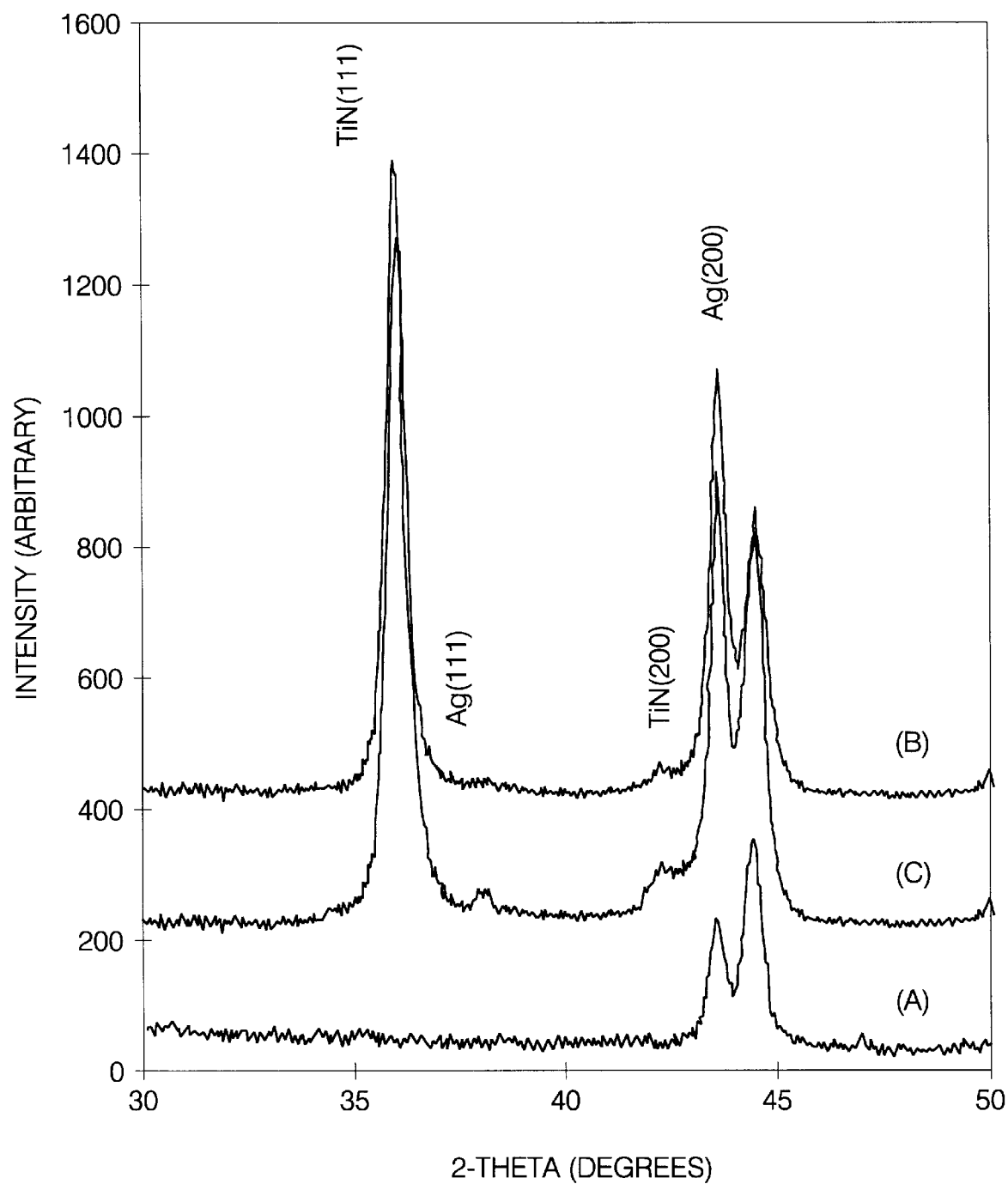
FIG. 2 contains three x-ray diffraction patterns of (a) a 301 stainless steel substrate, (b) a $TiN_{97}Ag_3$ coating and (c) a $TiN_{99}Ag_1$ coating prepared in accordance with the invention.

FIG. 1A illustrates a representative male electrical terminal 10 and female electrical terminal 12 that might be employed, for example, in an automotive application. These terminals may be used singly or a group of male terminals and a group of female terminals may be fixed in complementary plastic terminal housings so that several connections with several wires may be made at the same time. When such connectors are employed close to the engine in an underhood automotive application, they are subject to high temperatures (as high as 150° C.) and severe vibration. The vibration causes the terminals to rub against each other and to abrade coatings which are applied in order to prevent oxidation and resistance change in the electrically contacting surfaces of the terminals. Oxidation and wear of such conductive surfaces increases the contact resistance of the connection and impedes the effectiveness of the electrical circuit of which they are a part.

In many applications where a particular circuit is carrying an appreciable electrical current, the terminal body preferably is made of a low electrical resistance material such as a suitable copper or aluminum alloy. Where the particular terminal is in a sensor circuit or other low current flow circuit, the terminal body may, for example, be made of a higher resistance material such as 301 stainless steel or the like. As illustrated in FIG. 1B and in accordance with this invention, the surface of the electrically-conductive metal substrate 14 of the terminal 10 is provided with a codeposited composite coating that includes an electrically-conductive layer 16 of a ceramic such as titanium nitride with particles 18 of a highly conductive and preferably relatively low friction metal such as silver or gold. As shown in FIG. 1B, titanium nitride is a substantially continuous thin layer 16 and the metal is present as particles 18 on the surface of the titanium nitride layer 16.

In accordance with the invention, the codeposition of the ceramic material and metallic material is preferably accomplished by physical vapor deposition. For example, the deposition of various combinations of titanium nitride and silver on stainless steel substrates and titanium substrates was carried out in an ultra high vacuum, d.c. magnetron sputter deposition system with two sputter sources. The two sources, one a titanium target (99.995% titanium), the other a silver target (99.99% silver), were d.c. sputtered in a mixture of argon (99.999% pure) and nitrogen $N_2$ (99.999% pure) gases. The argon and nitrogen were supplied at a constant flow ratio of 8 standard cubic centimeters per minute (sccm) argon and 4 seem nitrogen. In the physical vapor deposition apparatus, an anode was added in proximity to the magnetron sources. A 301 stainless steel substrate (for example) was degreased in a 50/50 mixture of Buckeye Shop Master LpH Degreaser and deionized water using an ultrasound bath for 15 minutes. The substrate was then rinsed thoroughly with deionized water. It was then cleaned in an ultrasound bath with acetone and then in a bath of methanol, each for 15 minutes, before loading into the load lock of the physical vapor deposition system.

The base pressure of the deposition chamber was in the low $10^{-9}$ Torr range. When the load lock pressure reached $7 \times 10^{-7}$ Torr or lower, the valve between the load lock and the deposition chamber was opened.

The substrate surface was plasma cleaned for 30 minutes by applying a fixed bias of −550V to the substrate in pure argon. For this cleaning operation, the argon was supplied at a constant flow of 90 sccm at a pressure of about 140 mTorr with the substrate current in the range of 6 to 10 mA.

The substrate was not intentionally heated or cooled. It was initially at room temperature, and its temperature increased to about 95° C. during the vapor depositions. During the titanium nitride-silver deposition, the total pressure in the deposition chamber was from 5.7 to 6 mTorr. The titanium sputter source was operated at a fixed current of 0.475 amperes. The silver sputter source current was fixed at 0.18 amperes to generate the $TiN_{97}Ag_3$ nominal composition (Sample 1A) and at 0.16 amperes to generate the $TiN_{99}Ag_1$ nominal composition (Sample 1B). A third sample was prepared with just a titanium nitride (i.e., 0% silver) coating (Sample 1C). As is known, titanium atoms and silver atoms were ejected from the targets into a plasma containing positive nitrogen ions and some positive argon ions. The titanium atoms reacted with the nitrogen ions, and TiN was deposited as a layer on the substrate. Unreacted silver atoms were codeposited.

This apparatus could be employed to deposit titanium nitride-silver composite coatings on other substrates such as copper, copper alloys, aluminum and aluminum alloys and the like. For purposes of comparison, some titanium nitride-silver coatings had also been deposited on titanium substrates using the above-described apparatus in combination with an inductively coupled plasma-assisted vapor deposition process.

Characterization and Physical Properties of the Codeposited Metal-Ceramic Coatings The codeposited coating film (16, 18) structure was studied by x-ray diffraction (XRD) using a Siemens D500 θ—θ diffractometer with $CuK_\alpha$ radiation. The surface morphology was examined using a Hitachi S4000 scanning electron microscope (SEM). The wear spots and tracks produced during wear testing were examined with an ISI DS-130 SEM fitted with a Kevex Energy Dispersive x-ray Spectroscopy System (EDS). The mass thickness and compositions of the films were determined quantitatively by electron probe microanalysis (EPMA). The impurity content, composition uniformity and interface were studied by x-ray photoelectron spectroscopy (XPS) together with sputter depth profiling using 4 keV $Ar^+$ ions.

Figure 3:
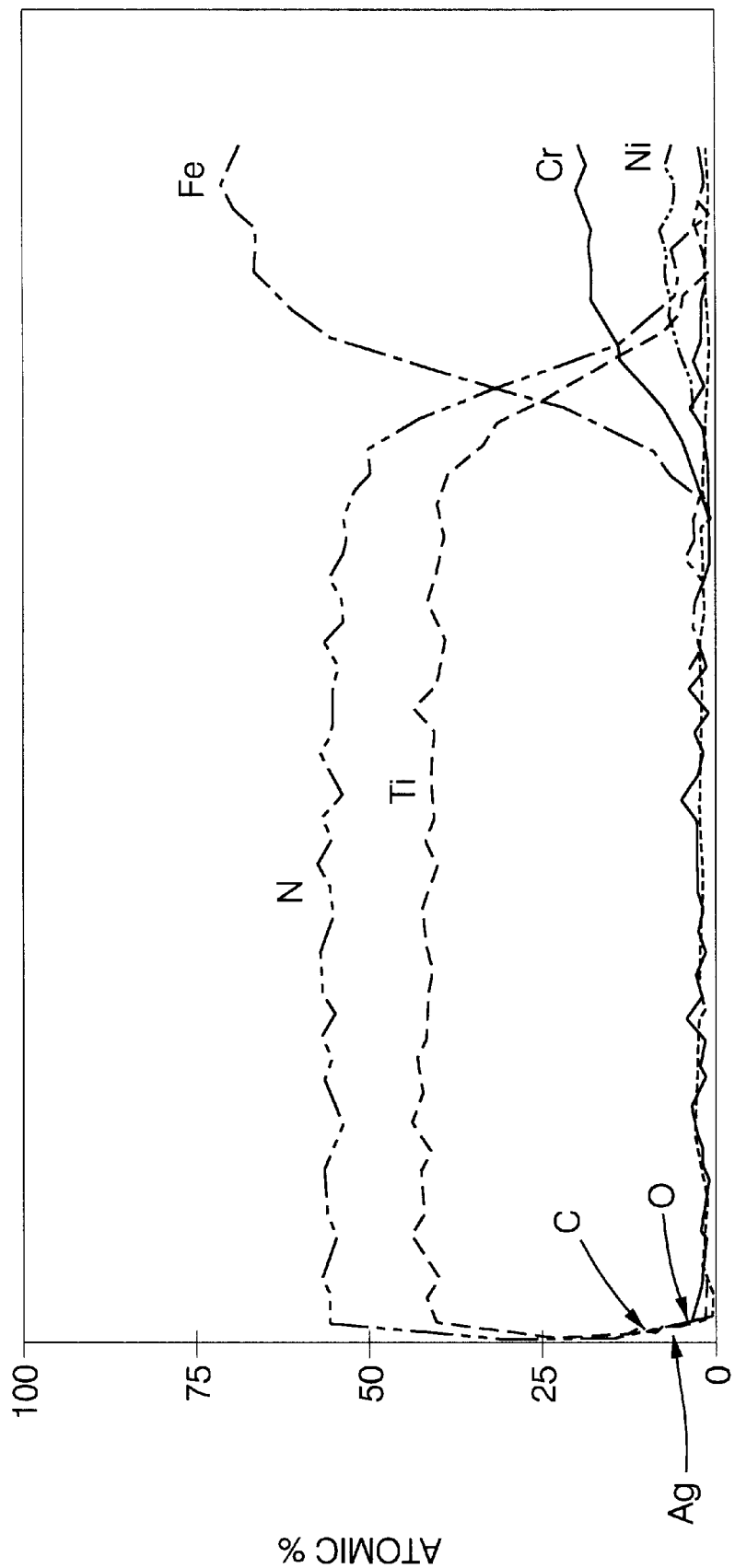
FIG. 3 is an x-ray photoelectron spectroscopy (XPS) sputter depth profile of a $TiN_{97}Ag_3$/301 stainless steel combination.

SEM observations of Sample 1A, 1B and 1C coatings showed that the silver-containing samples have silver nodules on the surface, as indicated schematically in FIG. 1B. EPMA of Samples 1A and 1B showed that Sample 1A had approximately 3.2 atomic percent silver, and 1B had 1.4 atomic percent silver (of the total Ag+TiN content). XPS depth profiling data shows that Ag is found at the surface of the film, with less than 1% in the TiN film (FIG. 3). Therefore, it is believed that the nodules 18 on the TiN surface is Ag. The XRD data (FIG. 2) shows a TiN(111) and Ag(111) peak. This indicates the material is a composite. The relative intensity of the Ag(111) peak of Sample 1A is larger than that of Sample 1B. The above data suggests that the 1A sample, with the Ag source current fixed at 0.18 Amp, contains more Ag than the 1B sample, with the Ag source current fixed at 0.16 Amp.

The friction coefficient was measured by a pin-on disk method using an Implant Sciences Corporation ISC-200 Tribometer. Measurements were made on the TiN and TiN—Ag specimens from both sample groups. In each case, the pins and disks are of the same material, where the pin is a piece of the specimen dimpled with a 3 mm radius mounted on a holder. All measurements were carried out at room temperature (21° C.) with 1 N force at 25 rpm for radii of 3.5 to 6.0 mm, and sliding distance was at least 2.0 m. The results were plotted as coefficient of friction versus sliding distance.

Figure 4:
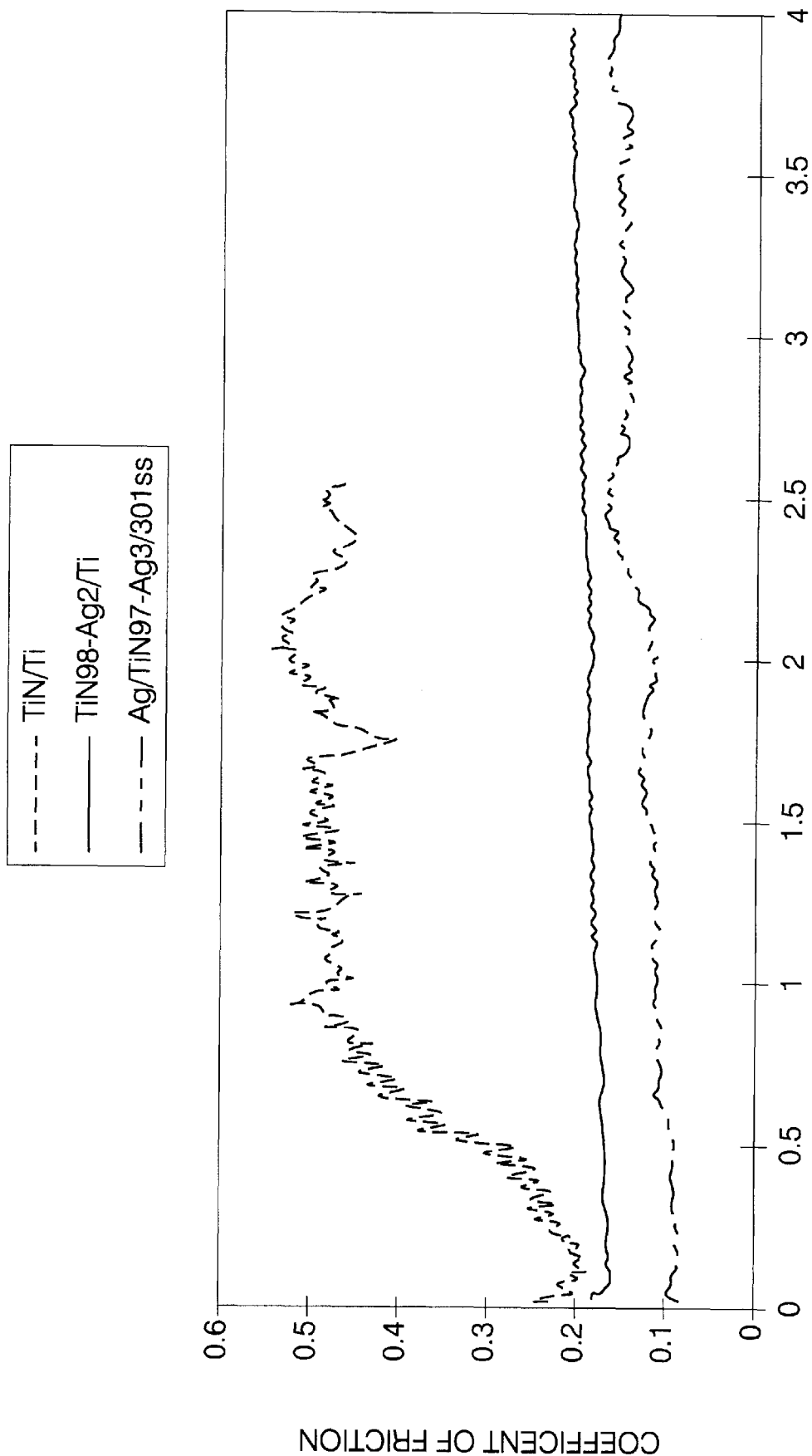
FIG. 4 is a graph of coefficient of friction vs. sliding distance for (a) a titanium nitride on titanium combination, (b) a $TiN_{98}Ag_2$ on titanium combination and (c) a silver on $TiN_{97}Ag_3$ 301 stainless steel combination.

The coefficient of friction as a function of sliding distance for TiN on Ti and $TiN_{98}$—$Ag_2$ on Ti samples obtained from pin-on-disk experiments is summarized in FIG. 4. For comparison, the coefficient of friction of a specimen with 200 nm Ag on TiN—Ag/301ss is also shown in FIG. 4. The coefficient of friction of TiN was 0.2 for the initial 0.3 m of sliding, then increases to 0.5 after 1.0 m of sliding and remains constant. The TiN—Ag films coefficient of friction is 0.2 at the beginning of test and increases at different rates as the atomic percent of silver is varied.

The TiN—Ag specimens that have a silver atomic percent less than 10 are more dense, while those above 10 atomic percent become less dense and porous with cluster. The compositions that are dense have a coefficient of friction that remains low for the entire sliding distance. The compositions that are less dense have a significant increase in the coefficient of friction over the sliding distance. A comparison is made with the coefficient of friction for TiN. These results show that by adding less than 10 atomic percent of Ag to TiN, a significant reduction in the coefficient of friction can be achieved.

The contact resistance of the coated specimens was measured with a probe as per ASTM B667. Measurements were made before and after heat aging at 150° C., 200° C. and 340° C. The specimens measured included TiN on 301 stainless steel and TiN—Ag of different compositions on Ti and 301 stainless steel (see the following Table). A solid gold rod with a 1.6 mm hemispherical radius was used for the probe tip. The measurements of contact resistance as a function of load were carried out at 0.5, 1, 2 and 5 N contact force. The contact resistance was averaged over five measurements for each contact force. The contact resistance measurements were made under dry-circuit conditions to prevent breakdown of insulating films. A low contact electrical resistance of a few mΩ can indeed be achieved.

TABLE 1

Contact Resistance vs. Load

| | LOAD (N) | | | |
|---|---|---|---|---|
| Material | 0.5 $R_m \pm \sigma$ (m$\Omega$) | 1 $R_m \pm \sigma$ (m$\Omega$) | 2 $R_m \pm \sigma$ (m$\Omega$) | 5 $R_m \pm \sigma$ (m$\Omega$) |
| TiN/Ti | 11860 ± 5120 | 6020 ± 1890 | 2830 ± 690 | 850 ± 180 |
| TiN/301ss | | 138.25 ± 21.36 | 76.50 ± 10.79 | |
| TiN$_{97}$—Ag$_3$ | 13.93 ± 5.96 | 7.57 ± 0.97 | 5.69 ± 0.89 | 4.35 ± 0.71 |
| TiN$_{99}$—Ag$_1$ | 8.71 ± 1.52 | 6.42 ± 1.12 | 5.36 ± 1.31 | 4.35 ± 1.03 |
| TiN$_{98}$—Ag$_2$ | 5.95 ± 1.04 | 4.21 ± 0.36 | 3.13 ± 0.15 | 2.25 ± 0.11 |
| TiN$_{87}$—Ag$_{13}$ | 3.85 ± 0.53 | 2.86 ± 0.20 | 2.35 ± 0.11 | 1.91 ± 0.09 |
| TiN$_{75}$—Ag$_{25}$ | 4.08 ± 0.45 | 3.33 ± 0.10 | 2.89 ± 0.05 | 2.46 ± 0.04 |

In addition to the above friction tests and contact resistance tests, the subject titanium nitride-silver coatings were also subjected to severe fretting wear tests and heated wiping wear tests and reciprocating wear tests. In each situation, the underlying titanium nitride layer with the silver particles demonstrated that it had good resistance to such wear situations.

Accordingly, in summary, it is seen that the titanium nitride-silver codeposited materials are strong, durable, wear-resistant, vibration-resistant coatings that also offer low friction and low contact resistance over prolonged usage and exposure. While the specific example of titanium nitride and silver has been demonstrated, it is also understood that titanium nitride may be used with gold.

While this invention has been described in terms of some specific embodiments, it will be appreciated that other forms can readily be adapted by one skilled in the art. Accordingly, the scope of this invention is to be considered limited only by the following claims.

We claim:

1. An electrical terminal comprising an electrically conductive metal body with a vapor codeposited coating layer consisting essentially of 90 to 99 atomic percent of titanium nitride and the balance a metal selected from the group consisting of silver and gold.

2. An electrical terminal comprising an electrically conductive metal body with a coating layer of codeposited titanium nitride and silver characterized by an adherent layer of titanium nitride with discrete microscopic particles of silver on said titanium nitride layer, said silver constituting 1 to 10 atomic percent of said coating.

* * * * *